United States Patent [19]
Lin et al.

[11] Patent Number: 5,358,604
[45] Date of Patent: Oct. 25, 1994

[54] METHOD FOR PRODUCING CONDUCTIVE PATTERNS

[75] Inventors: Charles W. C. Lin, San Antonio; Chung J. Lee, Austin; Tom J. Hirsch, Austin; Kimcuc T. Tran, Austin, all of Tex.

[73] Assignee: Microelectronics and Computer Technology Corp., Austin, Tex.

[21] Appl. No.: 953,520

[22] Filed: Sep. 29, 1992

[51] Int. Cl.5 .............................................. B05D 1/00
[52] U.S. Cl. .................................... 156/664; 427/58; 427/96; 427/97; 427/124; 427/264; 427/275; 427/307; 427/556; 204/112; 204/118; 204/261
[58] Field of Search .................... 427/58, 96, 97, 275, 427/264, 124, 556, 307; 156/664; 204/112, 118, 261

[56] References Cited

U.S. PATENT DOCUMENTS

| | | | |
|---|---|---|---|
| 3,013,913 | 8/1957 | Croop | 427/96 |
| 3,230,163 | 1/1966 | Dreyfus | 204/281 |
| 3,324,014 | 6/1967 | Modjeska | 205/122 |
| 4,053,370 | 10/1977 | Yamashita et al. | 204/231 |
| 4,159,222 | 6/1979 | Lebow et al. | 156/632 |
| 4,266,006 | 5/1981 | Uhlig et al. | 430/300 |
| 4,306,925 | 12/1981 | Lebow et al. | 156/150 |
| 4,403,828 | 9/1983 | Davis et al. | 359/883 |
| 4,546,065 | 10/1985 | Amendola | 430/313 |
| 4,606,787 | 8/1986 | Pelligrino | 156/632 |
| 4,715,116 | 12/1987 | Thorpe et al. | 29/846 |
| 4,781,991 | 11/1988 | Thorpe et al. | 428/626 |
| 4,790,902 | 12/1988 | Wada et al. | 156/630 |
| 4,889,584 | 12/1989 | Wada et al. | 156/630 |

*Primary Examiner*—Shrive Beck
*Assistant Examiner*—Vi Duong Dang
*Attorney, Agent, or Firm*—Pravel Hewitt Kimball & Krieger

[57] ABSTRACT

The invention provides an apparatus and methods of using the apparatus to transfer conductive patterns onto substrates under conditions of heat and pressure. The apparatus comprises a master mold with a printing surface on which is produced a permanent mirror image of the conductive pattern to be created. This pattern is then coated with a loosely adherent film of conductive metal, such as copper, which is transferred onto a substrate to be printed.

28 Claims, 1 Drawing Sheet

METHOD FOR PRODUCING CONDUCTIVE PATTERNS

BACKGROUND OF THE INVENTION

1. Field of the Invention

The invention relates to methods and apparatus for producing conductive patterns on a substrate. More particularly, the invention provides a mold on which can be created a thin metallic mirror-image of a conductive pattern which is then printed onto a substrate to produce the desired conductive pattern.

2. Description of the Related Art

Conductive patterns are commonly used in the manufacture of circuit boards that are used in a variety of applications, including providing the circuitry for computers. The known methods of producing printed circuit boards includes several techniques, the most common involving etching of a laminate substrate that is clad with a thin film of copper. The non-etched portion then forms the conductive pattern. In order to produce this pattern, a photoresist layer is first applied to the copper-clad laminate and the photoresist layer is then patterned by exposure to light through an artwork mask. In the case of a negative working photoresist, the areas of photoresist exposed to light are polymerized. The unpolymerized areas are then removed, typically by a chemical solution, exposing copper cladding but leaving the desired conductive pattern protected underneath the polymerized photoresist. The exposed copper is then etched away. After the etching is completed, the remaining polymerized photoresist is chemically removed to expose the copper conductive pattern.

This simple method of producing printed circuit suffers from the disadvantage that etching is not a precisely controllable process. Therefore, when fine lineworks and spacings are required, the lack of etching control becomes increasingly troublesome and may result in a high rejection rate for the completed circuit boards. Moreover, the deposition and etching of large areas of a continuous film produces stresses within the film and coated dielectric material. These stresses promote cracking, spalling of the foil from the dielectric, and dimensional instability. These undesirable effects are intensified when multiple layers of circuit board are used.

In order to produce a laminate with a thin coating of copper metal that can subsequently be etched as described above to provide a conductive pattern on the laminate surface, U.S. Pat. Nos. 4,715,116 and 4,781,991 disclose a process using a polished press plate coated with a layer of electrolytic copper. The coated press plate is laid on top of a suitable base material, such as epoxy resin impregnated glass cloth, and heat and pressure are applied to force the electrolytic layer of copper into the resin of the base material. After the resin is cooled, the press plate is separated from the substrate leaving the copper layer firmly adherent to the base material's surface. The press plate may then be recoated with copper for reuse in applying a copper surface to a suitable polymeric base material. Significantly, these patents do not teach or suggest the application of a conductive pattern to the polymeric base material. Rather, the teachings are restricted to the application of a continuous copper film over the entire surface of a base laminate substrate which might later be etched by conventional techniques to produce a conductive pattern.

U.S. Pat. No. 3,230,163 provides a reusable transfer plate for producing printed circuits on dielectric materials, the transfer plate having on its face a printed circuit flush with an insulating backing layer. In order to produce such a transfer plate, a laminate consisting of a thin foil upper metal layer and a dielectric backing layer of uncured thermosetting resin, is first etched according to any conventional process to form a positive conductive pattern on the metal foil. The conductive pattern is then plated with a hard metal film, such as a chromium film. The resultant product is then pressed in a laminating press which depresses the composite metal pattern into the dielectric while simultaneously curing the resin thereby ensuring intimate bondage of the embedded circuit pattern within the cured dielectric. The exposed surface of the laminated product transfer plate has a hard metal film flush with the surface of the hardened dielectric backing plate. This transfer plate may be used in the production of printed circuits. For instance, the metallic areas of the surface may be replated with electrolytic copper, which does not strongly adhere to the exposed chrome surface. This surface is then pressed onto a layer of resin under laminating conditions to transfer the copper pattern onto the resin layer and produce a conductive pattern thereon. There are several drawbacks to this method, however. For instance, it may be difficult or impossible to plate chromium onto isolated features of the circuitry since there is no plating interconnect for these features. The same problem arises when the electrolytic copper is replated. While an interconnecting bridge is a proposed solution, cutting the bridge mechanically with fine precision would probably require a laser whereas cutting the bridge chemically would require a masking step. In either case the process becomes significantly more complex.

U.S. Pat. No. 4,053,370 discloses a continuous process for the fabrication of printed circuits. In this continuous process, a metal endless strip is first selectively masked with a plating resist to produce a desired circuit pattern. The circuit pattern is then coated with copper by electroplating. The electroplated surface is pressed against an adhesive-coated strip to separate the copper pattern from the stainless steel strip and adhere it to the adhesive coating. The adhesive coated strip may then be bonded to a base strip to produce a circuit board.

U.S. Pat. No. 4,606,787 also uses a type of printing technique for producing a conductive pattern on an insulating material. The method involves first applying a thin flash layer of metal, such as copper, onto a rigid metal or metallized substrate. A thin layer of photoresist material is then applied to the copper surface. A mask is placed over the photoresist layer and the masked surface is exposed to light. Thereafter, the mask is removed and the photoresist is developed thereby producing cavities in the areas where the photoresist dissolves and exposes copper flash. The walls of these cavities are parallel to each other and perpendicular to the metallic substrate. The substrate is then placed in a high impingement speed plating apparatus which electrodeposits copper onto the exposed copper flash to a thickness not exceeding the depth of the cavities. The remaining photoresist layer is then chemically removed to expose a pattern of raised electroplated conductive circuit lines. An insulating layer is then laminated over the conductive circuit pattern under conditions of heat and pressure. When the insulating layer is stripped away from the metallic base, the conductive circuit pattern parts from the substrate and is molded and embedded in the insulating layer. The copper flash layer also adheres to the insulating material and may be removed by conventional etching techniques thereby exposing the conductive circuit pattern to produce the printed circuit board.

U.S. Pat. No. 3,324,014 is also directed to a method for making flush metallic patterns, like those of the 4,606,787 patent. The method includes the steps of coating a temporary support or transfer plate of highly polished relatively hard material with a parting layer that is not strongly adherent to the transfer plate. Thus, the parting layer may consist of dispersions of graphite, finely divided metallic conductor, organic polymers, and the like. A negative resist pattern is then applied over the parting layer and the resist is exposed to light through a mask work to produce a pattern in the resist. The negative resist is then removed and conductive metal is deposited in the spaces left by the removed resist. This forms a conductive pattern on the surface of the transfer plate. A suitable heat-moldable backing material is then molded against the surface of the transfer plate. This backing material is cured in situ by the application of heat and pressure so that it becomes securely bonded to the metallic pattern and completely conforms to the contours of the transfer plate surface. This backing layer or permanent support is then removed from the surface of the assembly taking with it an embedded conductive metallic pattern and the bulk of the parting layer. The parting layer may be removed from the surface of the permanent support by appropriate solvents or physical manipulation leaving behind a permanent support embedded with a printed circuit of conductive metal. In order to reuse the transfer plate for printing, the image of the conductive circuit must again be reproduced on its surface.

U.S. Pat. No. 4,159,222 discloses a method of printing circuitry that also requires the continual renewal or reproduction of a pattern on a polished substrate. The method entails placing a dry film of photoresist on a smooth polished substrate and optionally applying a thin lubricating layer to the exposed photoresist. A mask defining a desired conductive pattern is then brought into contact with the photoresist. This layered assembly is then exposed to light and the photoresist is developed to remove resist and form voids in those regions where the conductive pattern is to be formed. The developed assembly is then subjected to electroplating, to fill the voids formed by the removal of resist. After electroplating, all the remaining resist is removed and a flowable dielectric material is laminated to the electroplated surface of the substrate. The electroplated pattern becomes embedded in the dielectric material so that when the hardened dielectric material is removed, the pattern forms a conductive circuit in its smooth surface. In order to reuse the polished substrate as a "printer," it must again be treated by applying photoresist, exposing the photoresist through a mask, developing the photoresist, and electroplating the voids formed in the resist with a conductor.

U.S. Pat. Nos. 4,889,584 and 4,790,902 also relate to the production of conductor circuit boards by transferring a circuit pattern from an electrically conductive substrate to an insulating substrate by the process of lamination. However, neither of these patents disclose the use of a conductive master mold that may be used for printing conductive patterns onto insulating or dielectric substrates repeatedly, without having to reproduce the conductive pattern on the surface of the master mold by means of photolithography, or otherwise.

What is yet needed in the art is a transfer or printing method and apparatus for producing conductive patterns on dielectric or insulative materials without the need for utilizing photolithography or other techniques to repeatedly reproduce the conductive pattern on the transfer or printing mold. Further, the method and apparatus should desirably be inexpensive while producing fine line resolution so that it may be useful in high density applications.

SUMMARY OF THE INVENTION

The invention provides an apparatus and methods of using the apparatus to transfer conductive patterns onto substrates under conditions of heat and pressure. The apparatus comprises a master mold with a printing surface on which is produced a permanent mirror image of the conductive pattern to be created. This pattern is then coated with a loosely adherent film of conductive metal, such as copper, which is transferred onto a substrate to be printed.

The master mold is preferably fabricated from a conductive, hard metal, such as steel, and comprises a smooth surface that can be used for printing conductive patterns. To create the master mold, a mirror image of the desired conductive pattern is formed on the smooth surface of the mold by conventional techniques, such as photolithography or laser writing, or both. These processes produce voids of controllable depth in the surface of the master mold which are then filled with an organic polymeric material that has low surface energy i.e. that does not readily adhere to other materials. The polymeric fluorocarbons are examples of compositions with low adherence to other materials. Once the voids are filled, the filled mold surface is smoothed to produce a master mold surface having zones of conductive surface (the exposed metal surfaces) and zones of non-conductive surface (the polymeric surfaces).

The master mold so created may be used repeatedly to transfer conductive patterns onto substrates, especially the typical polymeric substrates used in the fabrication of circuit boards. To do so, the master mold is subjected to a coating process, which selectively coats only the conductive zones of its surface with a thin metallic film, leaving the non-conductive area uncoated. This metallic film is preferably of a type that is not tightly adherent to the non-conductive surfaces. The selectively coated master mold surface is then pressed under heat and pressure against a substrate resulting in a release of the thin metal film from the mold and printing of the film onto the substrate to produce a printed conductive pattern on the substrate when it is released from the mold's surface.

As an additional advantage of the invention, the master mold may be repeatedly used, without having to recreate the image of the conductive pattern on the surface of the master mold. Indeed, all that is required is the selective plating of the conductive area of the master mold with a thin, lightly-adherent layer of conductive metal in order to produce a pattern that may be printed onto a substrate. Thus, only two steps are repeated: selectively plating the master mold surface and printing the metal coating onto the desired substrate.

As pointed out above, the printing may be carried out onto any substrate, including thin films which may later be interconnected by lamination of the films one atop the other, to produce a complex interconnected circuit. Thus, the method provides the capability to produce patterns of such accuracy and fine delineation, that it may be used in a variety of applications.

BRIEF DESCRIPTION OF THE DRAWINGS

FIG. 1 is a schematic diagram of a cross section of a master mold in preparation showing sections removed by acid etching, laser engraving, or the like.

DETAILED DESCRIPTION OF THE INVENTION

The invention master mold apparatus may be produced from a variety of conductive molds, provided that the molds have at least one surface that is sufficiently smooth that it could be used in a process of transferring a conductive pattern onto a substrate. Preferably, the master mold is fabricated from a hard metal, such as steel, that can be treated with traditional photolithographic processes, or that can be engraved by means of a laser, to produce a desired pattern on the surface of the mold.

Figure 1:
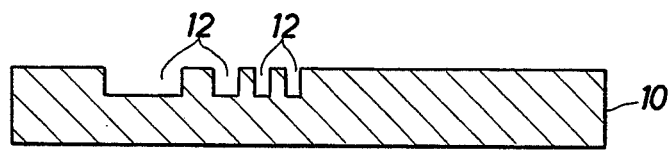

The smooth surface of the selected mold must first be treated to produce the desired pattern thereon. As indicated above, this treating may be carried out using any known method, including the traditional photolithographic processes and laser engraving or laser writing. In the case of photolithographic processes, the smooth surface of the master mold is first coated with a photoresist material. A maskwork, bearing an image of the conductive pattern that must be produced, is then overlayed onto the photoresist material. The resultant masked photoresist is then exposed to light and thereafter developed to remove non-polymerized photoresist so that an image of the desired conductive pattern is formed by the voids left from the removal of photoresist. The surface of this partially photoresist coated master mold is then subjected to an acid-etching process whereby the acid etches only those areas of the surface where the underlying steel mold is exposed. This etching process is carried for a predetermined length of time to produce channels or gaps in the mold surface of desired depth. After the etching process, the remaining photoresist is removed from the surface of the mold to produce a steel mold of the kind shown schematically in FIG. 1 in cross section.

As an alternative to the above-described photolithographic process, the steel mold surface may be patterned by laser writing. Thus, when a laser beam is applied, material is selectively removed from the surface of the mold by laser engraving to a predetermined depth. Further, when the laser engraving technique is utilized, it is desirable that the engravings have a surface roughness of at least about 100 to about 300 angstroms to provide a roughened surface to which a subsequently applied polymeric material may adhere. Thus, after laser engraving, the master mold resembles the schematic cross section shown in FIG. 1.

Applicant has actually reduced to practice the laser engraving embodiment of the present invention as follows: A Q-switched, frequency-doubled Nd:YAG laser (wavelength=532 nm) was used. The laser beam was expanded and focused into a conventional microscope which focused the beam onto a blank steel alloy mold by way of a 40 x long-working-distance (about 1 cm) objective. The long working distance was used to prevent metal slag ejected during laser writing from hitting the objective and obscuring the beam path. The beam was focused to a spot approximately 10 microns in diameter on the surface of the mold. Laser pulses of approximately 90 microjoules for approximately 70 nanoseconds duration were delivered to the mold at a pulse repetition rate of 100 Hz. The laser beam was held fixed while the mold was mounted on computer-controlled x-y stages. The stages moved the mold at a scan rate of 1 mm/second whereby the stationary laser beam formed the trenches in the mold. The best results were obtained when the laser was scanned once in each direction (left-to-right, then right-to-left; or up-down, then down-up) for every trench formed in the mold. The smallest lateral trench-to-trench spacing that could produce a well-defined central line (raised area between neighboring trenches) was 20 microns. This spacing produced a line approximately 10 microns wide with trenches approximately the same width. The depth of the twice scanned trenches was approximately 20 microns. In addition, laser scans spaced 10 microns apart produced wide trenches with no raised line therebetween with the width of the trenches controlled by the number of side-by-side scans. After laser writing, a raised ridge of residual slag was present along the edges of the trenches. This slag sometimes obscured the trenches as well. The slag was removed by applying ultrasonic cleaning and subsequent polishing.

It may be particularly advantageous to form the gaps or voids 12 using a combination of laser writing and wet chemical etching techniques, depending on the density of the circuitry involved. With high density circuitry, for example having line widths less than approximately 2 mils, a laser can very accurately micromachine the voids whereas the undercut from wet etching could probably not be tolerated. On the other hand, with low density circuitry, for instance having line widths equal to or greater than 2 mils, the wet etch undercut in the voids can probably be tolerated whereas laser writing, which in this application traces the negative image of the circuitry (field areas), may be very time consuming and relatively expensive. Therefore, molds for low density circuits are preferably treated to form the voids with a one-step process by conventional photolithography and wet chemical etching. However, molds for high density circuits are preferably treated to form the voids with a two-step process by (1) applying conventional photolithography and wet chemical etching to form the gross field areas (which do not contain the high density features); and then (2) laser writing the unetched areas where high density features are sought.

Figure 2:
FIG. 2 is a schematic diagram of the master mold of FIG. 1 coated with an insulative polymeric material that has low surface energy.

Regardless of the initial method for forming the gaps or voids 12 in the surface of the master mold 10, the mold must then be coated with a suitable insulative composition, preferably one that will provide a surface onto which metal coatings are nonadherent. Further, the insulative composition must not melt or flow under the subsequent application of heat and pressure in the printing step. Thus, the insulative coating 14 may comprise any halide-containing polymers, preferably fluorine-containing polymers. Particularly preferred insulative coatings are fluorocarbon polymers such as polytetrafluoroethylene (Teflon (Trademark)), $(-CF_2-CF_2-)_n$, $(-CF_2-CH_2-)_n$, $(-CF_2-CCl_2-)_n$, $(-CF_2-CClH-)_n$, $(-CF_2-CFH-)_n$, and oxygenated fluorocarbon polymers such as $(-CF_2-O-CF_2-)_n$. The most preferred insulative coating 14 is polytetrafluoroethylene. The insulative coating 14 is applied to the surface of the master mold 10 and fills the voids 12, as shown in FIG. 2.

Figure 3:
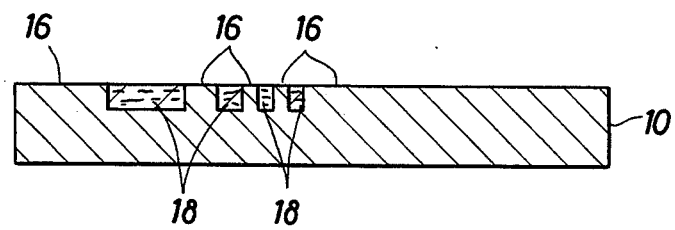
FIG. 3 is a schematic diagram of the master mold of FIG. 2, after polishing to remove excess insulator.

The surface of the master mold 10 is then polished to remove excess insulative coating and provide a smooth surface wherein the void spaces 12 have been filled with insulator, as shown in FIG. 3 which is a schematic cross sectional view of the completed master mold. The master mold now has zones of conductive surface 16 where the metal of the mold is at the surface and zones of nonconductive surface 18 where the polymeric insulator is at the surface.

Figure 4:
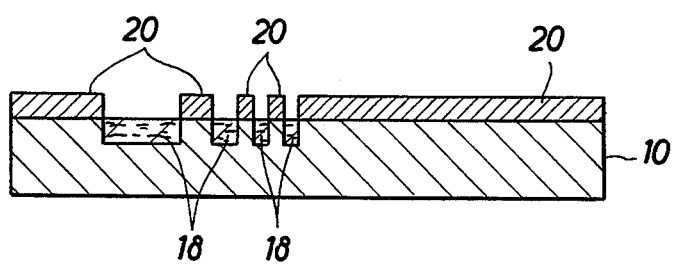
FIG. 4 is a schematic diagram of the polished master mold of FIG. 3 after it has been selectively coated with a metal on its conductive surfaces.

In order to use the master mold for transferring conductive patterns onto substrates, the metallic surface zones 16 on the master mold surface are coated with a conductive metal by any of the conventional techniques, including electroplating, electroless plating, and selective chemical vapor deposition. Preferably, electroplating should be used because it is inexpensive, provides the thickness of film needed and minimizes heavy metal waste production. The non-metallic surface zones 18 are not coated with metal during electroplating and electroless plating since they are non-conductive, nor during selective chemical vapor deposition since the deposition is localized to the metallic surface zones 16. As a result of the coating or metallization process, a thin film of metal 20 is coated onto the metal surfaces 16 of the master mold 10, as shown in FIG. 4. Clearly, this thin film may be formed of any metal that is usually utilized in the fabrication of conductive patterns, including, for example, copper, nickel, gold, vanadium, tungsten, silver and the like.

Figure 5:
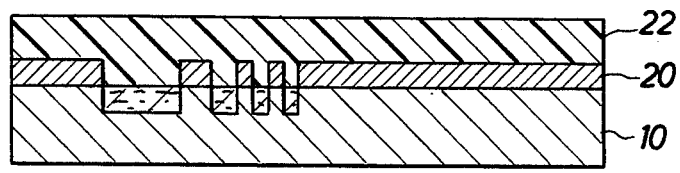
FIG. 5 is a schematic diagram of the selectively coated mold of FIG. 4 being pressed into a material to be printed.

The master mold with its metal surfaces 16 coated with a thin film of metal 20 is then pressed into a substrate to be printed 22, as shown in cross section in FIG. 5. The substrate to be printed may include a wide variety of film-form polymeric materials, for example, the B-staged thermosetting resins such as of epoxy, acrylate, bismaleicimide, or norbornane-, cyano-, and acetylene-containing prepolymers; and melt processable thermoplastics including polyimide, polyimidesiloxane, polyamide, polyamideimide, polyester, polycarbonate, polyethersulfone, polysulfone, polyketone, polyetherketone, and the like. The preferred thin film dielectric substrate is a hot melt processable polyimidesiloxane with a melting temperature ranging from about 100° C. to about 400° C., preferably from about 150° C. to about 300° C. Even more preferable are the polyimidesiloxanes that are crosslinkable under applied heat.

Figure 6:
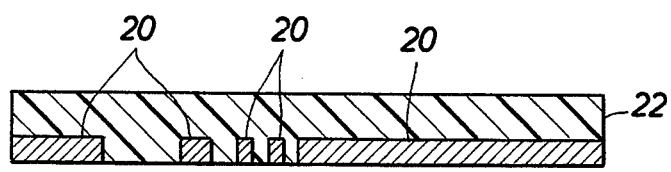
FIG. 6 is a schematic representation of the separation of the master mold from printed material thereby leaving an imprint of the conductive pattern on the printed material.
Figure 6:
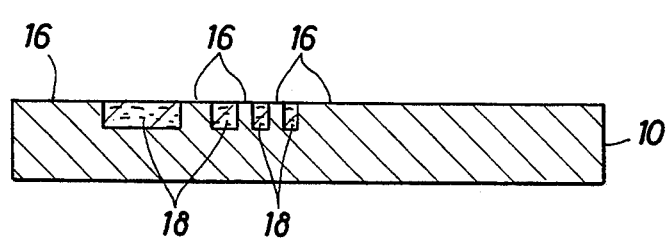

During the printing operation which is carried out under conditions of heat and pressure depending upon the composition of the dielectric substrate being printed, the dielectric substrate 22 flows and conforms to the surface of the electroplated master mold, as shown in FIG. 5. Thus, the thin metal film 20 is pressed into the surface of the dielectric material 22. At the conclusion of the printing or lamination step, heat and pressure are removed and the dielectric material is removed from the surface of the master mold, as shown in FIG. 6, to produce a dielectric substrate 22 with a conductive printed pattern 24 embedded in its surface as permanent circuitry. The master mold 10 now has a surface free of the thin film of metal 20 and may now be again subjected to coating for printing, as described above.

The above described method may be used to print conductive patterns onto thin films which may then be laminated together so that their circuitry interconnects to produce highly complex conductive patterns. These thin film laminates may be used in multilayer printed wire boards, 3-D packages, and multichip modules.

The master mold and printing process of the invention may also be used to produce products including interconnect patterns for flip chip bonding and chip on board interconnection.

Although the invention has been described with reference to its preferred embodiments, those of ordinary skill in the art may, upon reading this disclosure, appreciate changes and modifications which do not depart from the scope and spirit of the invention as described above or claimed hereafter.

What is claimed:

1. A method of making conductive patterns, comprising:
   (1) selecting a mold with at least one surface, said surface being treatable to produce a pattern on said surface;
   (2) treating the surface of the mold to selectively remove material to a preselected depth from portions of the surface of the mold, thereby creating gaps in the surface and producing a pattern on the mold surface corresponding to a mirror image of a desired conductive pattern;
   (3) filling the gaps created by the selective removal of material with a composition that is resistant to metallization;
   (4) metallizing the mirror image pattern on the surface of the mold without metallizing the filled gaps; and
   (5) printing the metallized mirror image pattern onto a substrate by transferring said metallized mirror image pattern to said substrate without the removal of said filling composition in said gaps so as to produce a conductive pattern on the surface of the substrate.

2. The method of claim 1 wherein the selecting includes selecting a metallic mold.

3. The method of claim 1 wherein the treating comprises writing by means of a laser beam.

4. The method of claim 1 wherein the treating comprises wet chemical etching.

5. The method of claim 1 wherein the filling is with an organic polymer.

6. The method of claim 5 wherein the filling is with an organic fluorocarbon polymer.

7. The method of claim 1 wherein the metallizing is by coating with a metal selected from the group consisting of nickel, gold, palladium, aluminum, copper, and tungsten.

8. The method of claim 1 wherein the metallizing is by a process selected from the group consisting of electroless plating, electroplating and selective chemical vapor deposition.

9. The method of claim 1 further comprising, after printing, repeating the steps of metallizing the mirror image on the surface of the mold and printing the metallized mirror image pattern onto another substrate.

10. The method of claim 3 wherein the laser writing produces a roughness of at least about 200 angstroms in laser written areas.

11. The method of claim 3 wherein the laser writing scans each gap at least twice.

12. The method of claim 3 wherein the treating includes removing residual slag from the mold after laser writing.

13. The method of claim 12 wherein removing the residual slag includes ultrasonic cleaning and subsequent polishing of the mold.

14. The method of claim 3 wherein the treating includes wet chemical etching.

15. The method of claim 14 wherein the treating includes:
patterning a photoresist mask on the mold,
wet chemical etching the mold through openings in the mask,
stripping the mask, and
laser writing unetched regions of the mold.

16. The method of claim 15 wherein the gaps formed by laser writing are narrower than the gaps formed by wet chemical etching.

17. The method of claim 16 wherein the gaps having a width equal to or greater than approximately 2 mils are formed by wet chemical etching whereas the gaps having a width less than approximately 2 mils are formed by laser writing.

18. The method of claim 1 wherein the printing comprises printing onto a polymeric film.

19. The method of claim 1 wherein the printing comprises printing onto a film selected from the group consisting of thermosetting resins and melt-processable thermoplastics.

20. The method of claim 1 wherein the selecting includes a steel mold, the treating is by a method selected from the group consisting of wet chemical etching and laser writing; the filling is with an organic fluorocarbon polymer composition; the metallizing is with a metal selected from the group consisting of copper, gold and aluminum; and the printing comprises printing permanent circuitry into a film selected from the group consisting of B-staged thermosetting resins and melt-processable thermoplastics.

21. The method of claim 1, wherein the filling step comprises filling with an insulative composition.

22. The method of claim 21, wherein the step of printing comprises printing under conditions of applied heat and pressure.

23. The method of claim 1, further comprising smoothing the surface of the mold, after the step of filling with a composition, to remove excess coating.

24. The method of claim 23, wherein the step of smoothing comprises polishing.

25. The method of claim 1, wherein the filling comprises filling with a composition that adheres to the gaps in the mold.

26. The method of claim 3, wherein the filling comprises filling gaps with a roughened surface created by the step of writing with a laser beam, said roughened surface allowing adherence of the composition to the gaps.

27. The method of claim 1, wherein all the metallized mirror image pattern is printed onto the substrate in the printing step.

28. The method of claim 3, further comprising removing any raised ridges of slag along edges of the gaps by a process comprising polishing.

* * * * *